(12) United States Patent       (10) Patent No.:     US 7,541,653 B2
    Kim                          (45) Date of Patent:     Jun. 2, 2009

(54) MASK ROM DEVICES OF SEMICONDUCTOR DEVICES AND METHOD OF FORMING THE SAME

(75) Inventor: Kyoung-Hwan Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 97 days.

(21) Appl. No.: 11/158,107

(22) Filed: Jun. 21, 2005

(65) Prior Publication Data

US 2006/0002202 A1    Jan. 5, 2006

(30) Foreign Application Priority Data

Jul. 2, 2004    (KR) ................ 10-2004-0051642

(51) Int. Cl.
 H01L 29/76   (2006.01)
 H01L 29/94   (2006.01)
 H01L 31/062  (2006.01)
 H01L 31/113  (2006.01)
 H01L 31/119  (2006.01)

(52) U.S. Cl. .............. 257/390; 257/327; 257/335; 257/336; 257/344; 257/382; 257/383; 257/384; 257/391; 257/408; 257/900; 257/E29.156; 257/E29.161

(58) Field of Classification Search ........... 257/327, 257/335–336, 344, 382–384, 390–391, 408, 257/900, E29.156, E29.161
See application file for complete search history.

(56) References Cited

U.S. PATENT DOCUMENTS

| | | | | |
|---|---|---|---|---|
| 4,690,730 A | * | 9/1987 | Tang et al. ............ | 438/649 |
| 4,873,557 A | * | 10/1989 | Kita ................... | 257/344 |
| 5,089,865 A | * | 2/1992 | Mitsui et al. .......... | 257/384 |
| 5,119,153 A | * | 6/1992 | Korman et al. ......... | 257/341 |
| 5,146,291 A | * | 9/1992 | Watabe et al. ......... | 257/344 |
| 5,168,332 A | * | 12/1992 | Kunishima et al. ...... | 257/385 |
| 5,320,957 A | * | 6/1994 | Cederbaum et al. ...... | 438/153 |
| 5,428,240 A | * | 6/1995 | Lur .................... | 257/389 |
| 5,444,282 A | * | 8/1995 | Yamaguchi et al. ...... | 257/344 |
| 5,631,484 A | * | 5/1997 | Tsoi et al. ............ | 257/341 |
| 5,663,570 A | * | 9/1997 | Reedy et al. ........... | 257/9 |
| 5,751,045 A | * | 5/1998 | Choi et al. ............ | 257/392 |
| 5,883,418 A | * | 3/1999 | Kimura ................. | 257/412 |
| 5,929,483 A | * | 7/1999 | Kim et al. ............. | 257/336 |
| 5,982,001 A | * | 11/1999 | Wu ..................... | 257/344 |
| 5,985,723 A | | 11/1999 | Hsu .................... | 438/278 |

(Continued)

FOREIGN PATENT DOCUMENTS

JP    04-257259    9/1992

(Continued)

*Primary Examiner*—Ida M Soward
(74) *Attorney, Agent, or Firm*—F. Chau & Associates, LLC

(57) ABSTRACT

Disclosed are a mask ROM device and a method of forming the same. This device includes a plurality of cells. At least one among the plurality of cells is programmed. The programmed cell includes a cell gate pattern, cell source/drain regions, a cell insulating spacer, a cell metal silicide, and a cell metal pattern. The cell metal pattern is extended along a surface of a cell capping pattern being the uppermost layer of the cell insulating spacer and the cell gate pattern to be electrically connected to cell metal silicide at opposing sides of the cell gate pattern.

10 Claims, 11 Drawing Sheets

U.S. PATENT DOCUMENTS

| | | | |
|---|---|---|---|
| 5,990,493 A * | 11/1999 | Gardner et al. | 257/77 |
| 6,025,620 A * | 2/2000 | Kimura et al. | 257/296 |
| 6,072,222 A * | 6/2000 | Nistler | 257/383 |
| 6,136,705 A * | 10/2000 | Blair | 438/682 |
| 6,156,593 A * | 12/2000 | Peng et al. | 438/200 |
| 6,236,091 B1 * | 5/2001 | Ngo et al. | 257/383 |
| 6,268,633 B1 * | 7/2001 | Pio et al. | 257/391 |
| 6,287,916 B1 * | 9/2001 | Mehta | 438/257 |
| 6,369,423 B2 * | 4/2002 | Ohiwa et al. | 257/327 |
| 6,518,618 B1 * | 2/2003 | Fazio et al. | 257/315 |
| 6,531,737 B2 * | 3/2003 | Okada et al. | 257/344 |
| 6,657,244 B1 * | 12/2003 | Dokumaci et al. | 257/288 |
| 6,787,845 B2 * | 9/2004 | Deleonibus | 257/327 |
| 6,861,704 B2 * | 3/2005 | Asada et al. | 257/336 |
| 6,888,183 B1 * | 5/2005 | Yamaha | 257/288 |
| 6,943,110 B1 * | 9/2005 | Lur et al. | 438/683 |
| 7,002,223 B2 * | 2/2006 | Kwon | 257/384 |
| 7,060,554 B2 * | 6/2006 | Ngo et al. | 438/240 |
| 7,098,514 B2 * | 8/2006 | Oh et al. | 257/384 |
| 7,105,429 B2 * | 9/2006 | Jawarani | 438/592 |
| 7,157,777 B2 * | 1/2007 | Tsuchiaki et al. | 257/382 |
| 7,176,110 B2 * | 2/2007 | van Bentum et al. | 438/478 |
| 2001/0045594 A1 * | 11/2001 | Chang | 257/315 |
| 2003/0038305 A1 * | 2/2003 | Wasshuber | 257/213 |
| 2005/0282395 A1 * | 12/2005 | Chang et al. | 438/740 |
| 2006/0208319 A1 * | 9/2006 | Chakihara et al. | 257/369 |
| 2007/0034968 A1 * | 2/2007 | Nishida et al. | 257/369 |

FOREIGN PATENT DOCUMENTS

| | | |
|---|---|---|
| JP | 04-342168 | 11/1992 |
| JP | 04-348567 | 12/1992 |
| JP | 09-074145 | 3/1997 |
| KR | 10-2004-017158 | 5/1998 |
| KR | 100209735 B1 | 4/1999 |

\* cited by examiner

MASK ROM DEVICES OF SEMICONDUCTOR DEVICES AND METHOD OF FORMING THE SAME

CROSS-REFERENCE TO RELATED APPLICATIONS

This application claims priority under 35 U.S.C. § 119 to Korean Patent Application No. 2004-51642, filed on Jul. 2, 2004, the contents of which are hereby incorporated by reference in its entirety.

FIELD OF THE INVENTION

This invention generally relates to semiconductor devices and methods of fabricating the same and, more specifically, to a mask ROM (Read Only Memory) device and a method of forming the same.

BACKGROUND OF THE INVENTION

Mask ROMs of semiconductor devices have nonvolatile characteristics in that data is retained in the memory even if the power supply is turned off. In addition, only read operations with respect to already-written data can be performed with the mask ROMs. Because the mask ROMs are coded with the data in respective cells during the process of forming the mask ROM devices, the data stored in the mask ROMs cannot be erased or rewritten. Generally, a coding method selectively implants impurity ions after forming cells constituted with MOS transistors.

FIGS. 1 and 2 are cross-sectional views illustrating a conventional coding method of a mask ROM device.

With reference to FIGS. 1 and 2, a device isolation layer (not shown) is formed on a semiconductor substrate 1 having first and second regions 10 and 20 to define respective active regions. The first region 10 is a region in which cells not performing a program process are formed, and the second region 20 is a region in which cells performing the program process are formed. N-type impurity ions are implanted on the surface of the active region to form a surface doped layer 2.

A gate oxide layer 3 and a gate electrode 4, which are sequentially stacked, are formed on the active region. A plurality of gate electrodes 4 are formed on the substrate 1. N-type impurity ions are implanted using the gate electrode 4 as a mask to form source/drain regions 5. The surface doped layer 2 under the gate electrode 4 corresponds to a depletion mode channel region. The gate electrode 4, the source/drain regions 5, and the depletion mode channel region form a unit cell of a mask ROM device. By the depletion channel region, the cells are in a turn-on state.

A lithography process is performed on the semiconductor substrate 1 to form a photoresist pattern 6. An opening 7 for exposing a selected cell can be formed in the photoresist pattern 6. In other words, the photoresist pattern 6 covers the cell in the first region 10, and the opening 7 exposes the cell in the second region 20. The opening 7 exposes a gate electrode 4 of the selected cell. In addition, the opening 7 may expose a part of the source/drain regions 4 of the selected cell.

P-type impurities are implanted using the photoresist pattern 6 as a mask to dope P-type impurities in the depletion mode channel region of the selected cell. Thus, the selected cell can be changed to a turn-on or turn-off state according to the voltages applied to the gate electrode 4.

In the above-mentioned conventional method for coding the mask ROM device, P-type impurity ions for programming penetrate the gate electrode 4 of the selected cell to be implanted into the depletion mode channel region. Accordingly, lattice damages may occur in the gate electrode 4 of the selected cell by ion implantation. Additionally, there may be intrusions at the interfaces between the gate electrode 4 and the gate oxide layer 3 and/or the gate oxide layer 3 and the active region. Therefore, the characteristics of leakage current in the selected cell may degrade. In addition, the P-type impurity ions are implanted in a Gaussian profile and may be implanted into the source/drain regions 5 of the selected cell. Accordingly, different types of impurities are implanted into the source/drain regions 5 of the selected cell, and thereby degrading punch-through characteristics between the source/drain regions 5 of the selected cell.

Furthermore, high ion implantation energy is required because P-type ion impurities may penetrate the gate electrode 4. Therefore, high-energy ion implantation apparatus is needed, and it results in poor productivity.

SUMMARY OF THE INVENTION

One embodiment of the present invention provides a mask ROM device. The mask ROM device includes a plurality of cell strings having a plurality of cells that are serially connected, respectively. At least one cell string of the cells is programmed. The programmed cell includes a cell gate pattern having a cell gate insulating layer, a cell gate electrode, and a cell capping pattern, which are sequentially stacked on a substrate. Cell source/drain regions are placed at the substrate at opposing sides of the cell gate pattern, and a cell insulating spacer is placed at opposing sidewalls of the cell gate pattern. A cell metal silicide is placed on a surface of the cell source/drain regions. A cell metal pattern is extended along the surfaces of the cell insulating spacer and the cell capping pattern to be connected to cell metal silicide at opposing sides of the cell gate pattern.

The mask ROM device may further include a peripheral circuit transistor. The peripheral circuit transistor may include peripheral circuit source/drain regions, a peripheral circuit insulating spacer, and a peripheral circuit metal silicide. The peripheral circuit source/drain regions are formed on the substrate at opposing sidewalls of the peripheral circuit gate pattern. The peripheral circuit insulating spacer is formed at opposing sidewalls of the peripheral circuit gate pattern. The peripheral circuit metal silicide is formed on the surface of the peripheral circuit source/drain regions. The peripheral circuit metal silicide and the metal silicide include the same metal. The cell metal silicide and the cell metal pattern may include the same metal. The mask ROM device may further include a cell reaction preventing pattern covering the cell metal pattern. The cell reaction preventing pattern may be formed of a conductive metal nitride.

In an embodiment, the cell string may further include first and second selection transistors, which are serially connected to one side of the cells. The selected selection transistor may include a selection gate pattern, selection source/drain regions, a selection insulating spacer, a selection metal silicide, and a selection metal pattern, which are formed on the substrate. The selection gate pattern includes a selection gate insulating layer, a selection gate electrode, and a selection capping pattern, which are sequentially stacked on the substrate. The selection source/drain regions are formed on the substrate at opposing sides of the selection gate pattern. The selection insulating spacer is placed at opposing sidewalls of the selection gate pattern, and the selection metal silicide is placed on a surface of the selection source/drain regions. The selection metal pattern is extended along the surfaces of the selection insulating spacer and the selection capping pattern to connect to the selection metal silicide at opposing sides of the selection gate pattern. Preferably, the cell and the selection metal patterns, and the cell and the selection metal silicide include the same metal as one another. The mask ROM device may further include a selection reaction preventing pattern covering the selection metal pattern. The selection reaction preventing pattern may be formed of conductive metal nitride.

Another embodiment of the present invention provides a method for forming a mask ROM device. According to this method, the mask ROM device includes a plurality of cell strings having a plurality of cells that are serially connected, respectively. In this case, at least one cell among the plurality of cells is programmed. Also, this method includes a method of forming the programmed cell comprising the following steps. In advance, a cell gate pattern including a cell gate insulating layer, a cell gate electrode, and a cell capping pattern is formed. The cell gate insulating layer, the cell gate electrode, and the cell capping pattern are sequentially stacked on the substrate. Then, cell source/drain regions are formed on the substrate at opposing sides of the cell gate pattern. A cell insulating spacer is formed at opposing sidewalls of the cell gate pattern, and a metal layer is deposited on an entire surface of the substrate. A silicidation process is performed to form a cell metal silicide on the cell source/drain regions. The unreacted metal layer is patterned to form a cell metal pattern. The cell metal pattern is extended along surfaces of the cell insulating spacer and the cell capping pattern to connect to the cell metal silicide at opposing sides of the cell gate pattern.

The mask ROM device may further include a peripheral circuit transistor. The method for forming the peripheral circuit transistor may include the following steps. First, a peripheral circuit gate pattern is formed on the substrate. Second, peripheral circuit source/drain regions are formed on the substrate at opposing sides of the peripheral circuit gate pattern. A peripheral circuit insulating spacer is formed at opposing sidewalls of the peripheral circuit gate pattern, and a peripheral circuit metal silicide is formed on a surface of the peripheral circuit source/drain regions. In this case, it is preferable that the peripheral circuit metal silicide be formed simultaneously with the metal layer that is formed on the entire surface of the substrate and the cell metal silicide by the silicidation process. In forming the cell metal pattern, the unreacted metal layer on the peripheral circuit gate pattern and the peripheral circuit insulating spacer are removed. The steps of depositing the metal layer and performing the silicidation process may be performed in-situ. The above-mentioned step may further include a step of forming a reaction preventing layer on the entire surface of the substrate. In this case, the step of forming the cell metal pattern may include a step of successively patterning the reaction preventing layer and the unreacted metal layer to form a cell reaction preventing layer covering the cell metal pattern. The cell reaction preventing pattern may be formed of conductive metal nitride.

In an embodiment, the cell string may further include first and second selection transistors, which are serially connected to one side of the cells. The method for forming the selected selection transistor among the first and second selection transistors may include the following formation steps. A selection gate pattern including a selection gate insulating layer, a selection gate electrode, and a selection capping pattern is formed. The selection gate insulating layer, the selection gate electrode, and the selection capping pattern are sequentially stacked on the substrate. Selection source/drain regions are formed on the substrate at opposing sides of the selection gate pattern. A selection insulating spacer is formed at opposing sidewalls of the selection gate pattern. A selection metal silicide is formed on the surface of the selection source/drain regions. A selection metal pattern, which is extended along the surfaces of the selection insulating spacer and the selection capping pattern to be connected to the selection metal silicide at opposing sides of the selection gate pattern, is formed. In this case, the step of forming the cell and selection metal silicide, and the cell and selection metal patterns may include the following steps. The metal layer is formed on an entire surface of the substrate including the cell and the selection gate patterns, the cell and the selection source/drain regions, and the cell and selection insulating spacers. The silicidation process is performed to form the cell and the selection metal silicide, and the unreacted metal layer is patterned to form the cell and the selection metal patterns. The cell and the selection gate patterns are formed simultaneously. The cell and the selection source/drain regions are formed simultaneously. The cell and the selection insulating spacers may be formed simultaneously. The above-mentioned method may further include a step of forming a reaction preventing layer on an entire surface of the substrate before forming the cell and the selection metal patterns. In this regards, the step of forming the cell and the selection metal patterns may include a step of successively patterning the reaction preventing layer and the unreacted metal layer to form a cell and a selection reaction preventing pattern and the cell and the selection metal patterns. The cell and the selection reaction preventing patterns cover the cell and selection metal patterns, respectively. The cell and selection reaction preventing layer may be formed of conductive metal nitride.

In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

BRIEF DESCRIPTION OF THE DRAWINGS

FIGS. 5A to 7A are cross-sectional views illustrating a method of forming the mask ROM device according to an embodiment of the present invention taken along line I-I' in FIG. 3.

FIGS. 5B to 7B are cross-sectional views illustrating the method of forming the mask ROM device according to an embodiment of the present invention taken along line II-II' in FIG. 3.

FIGS. 5C to 7C are cross-sectional views illustrating the method of forming the mask ROM device according to an embodiment of the present invention taken along line III-III' in FIG. 3.

DETAILED DESCRIPTION OF THE PREFERRED EMBODIMENT

The present invention will be described more fully hereinafter with reference to the accompanying drawings in which exemplary embodiments of the invention are shown.

Figure 1:
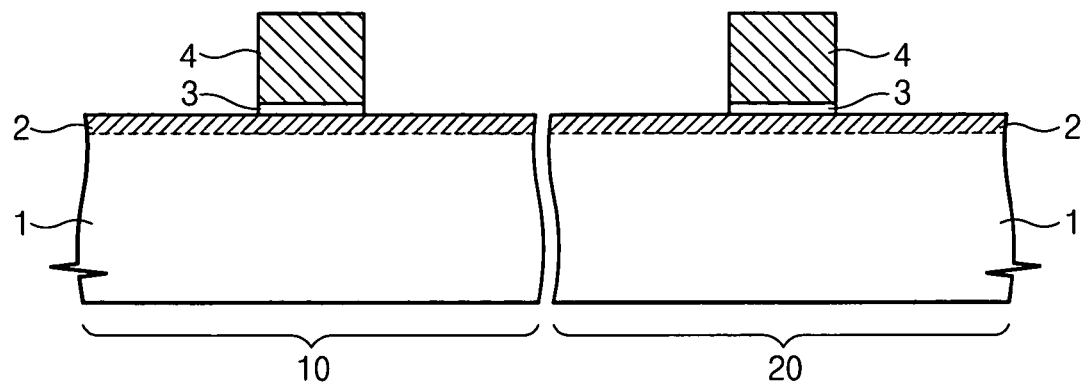
FIGS. 1 and 2 are cross-sectional view illustrating a coding method of a conventional mask ROM device.
Figure 2:
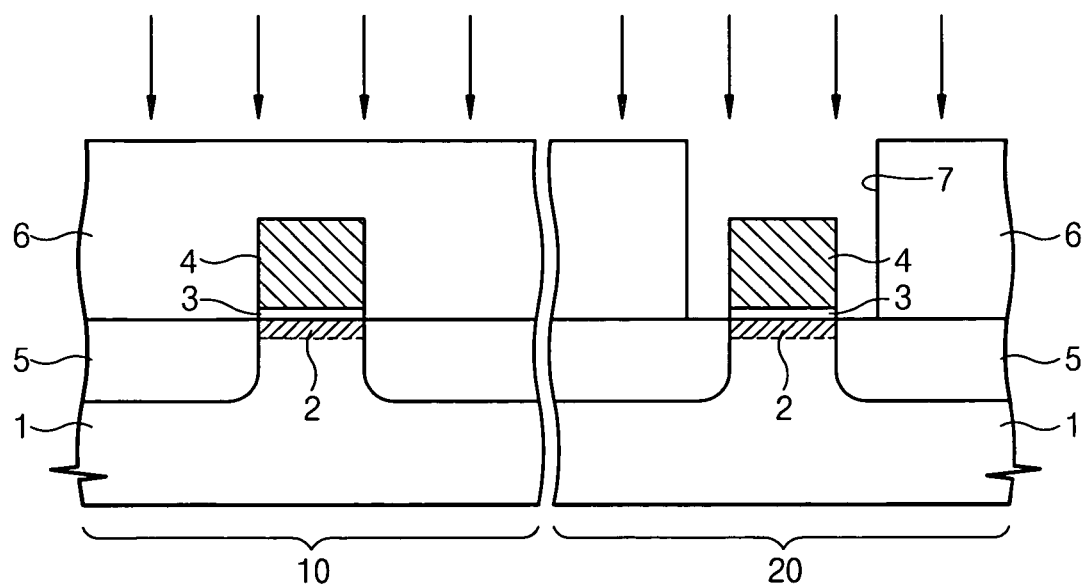
Figure 3:
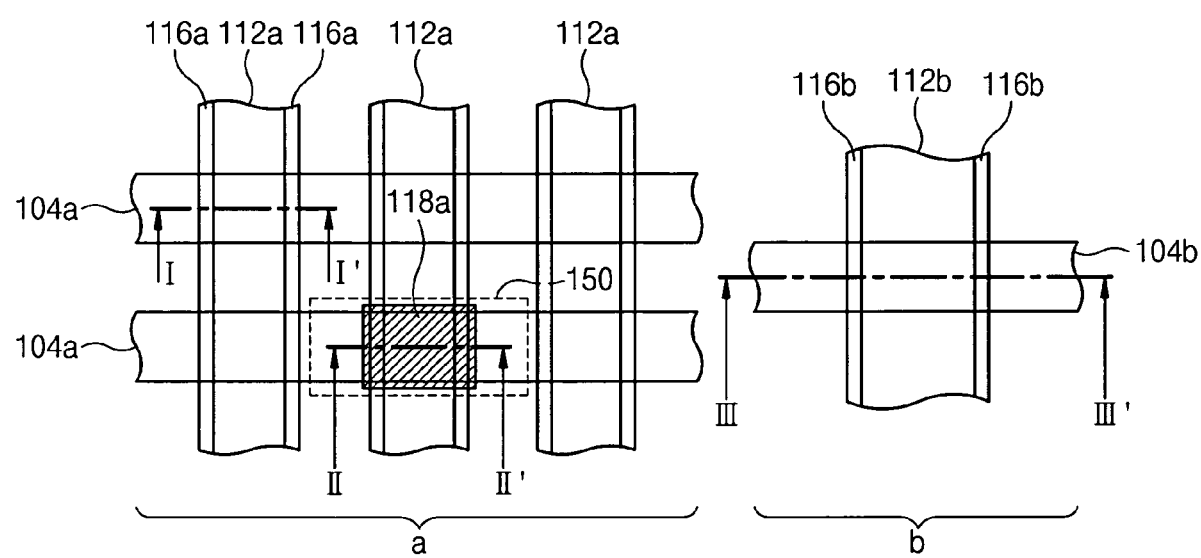
FIG. 3 is a plan view showing a mask ROM device according to an embodiment of the present invention.
Figure 4A:
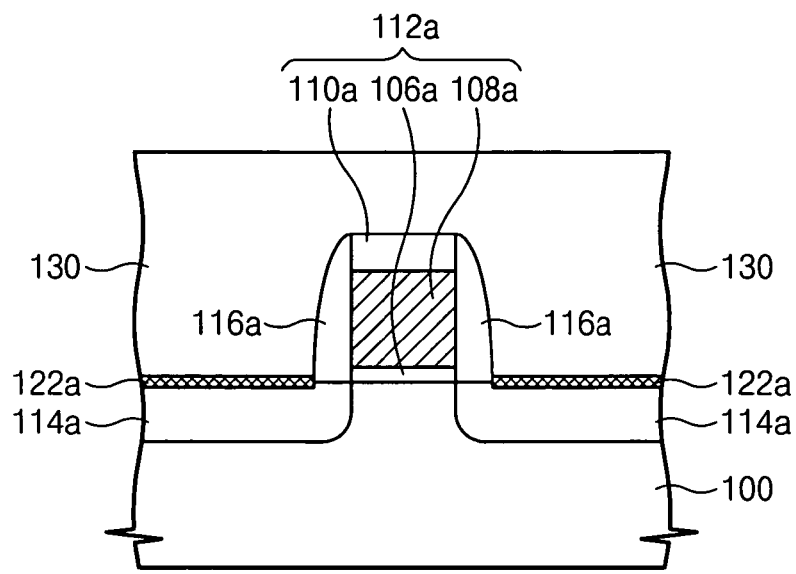
FIGS. 4A, 4B, and 4C are cross-sectional views taken along lines I-I', II-II', and III-III' respectively in FIG. 3.
Figure 4B:
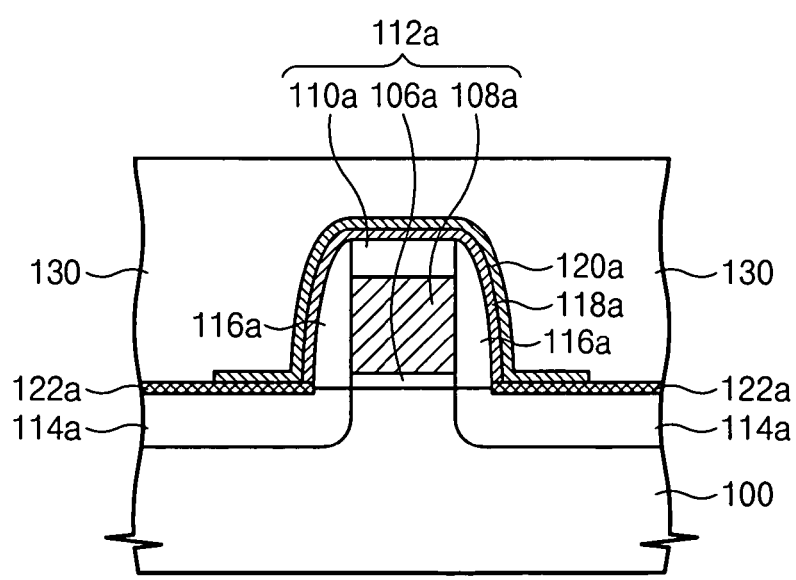
Figure 4C:
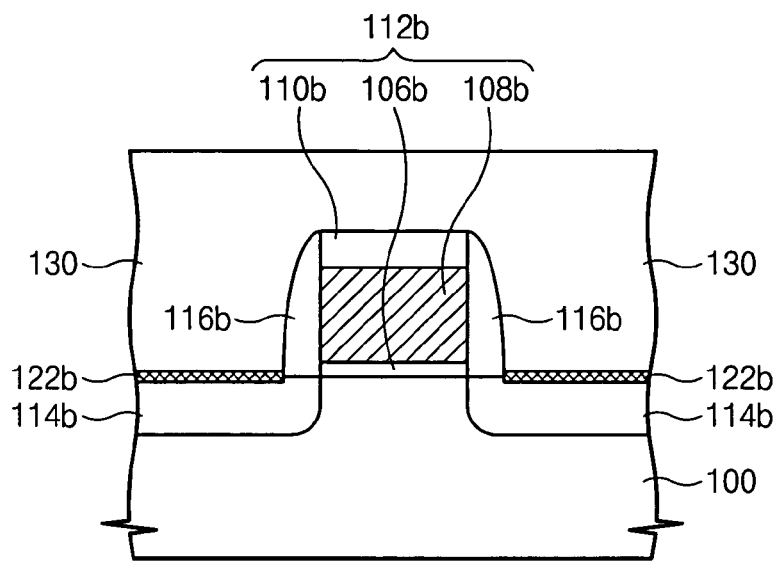
Figure 5A:
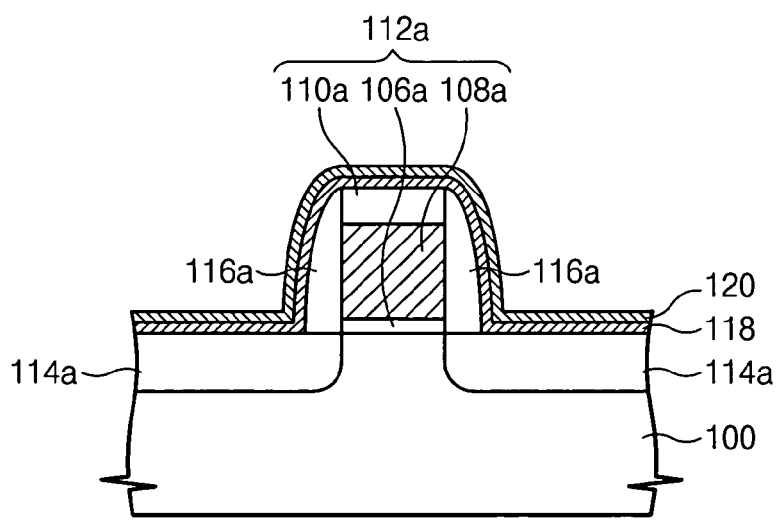
Figure 5B:
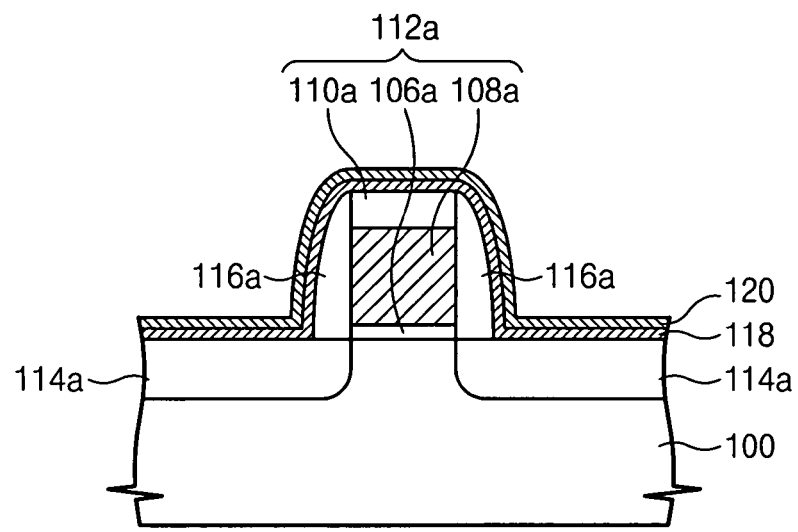
Figure 5C:
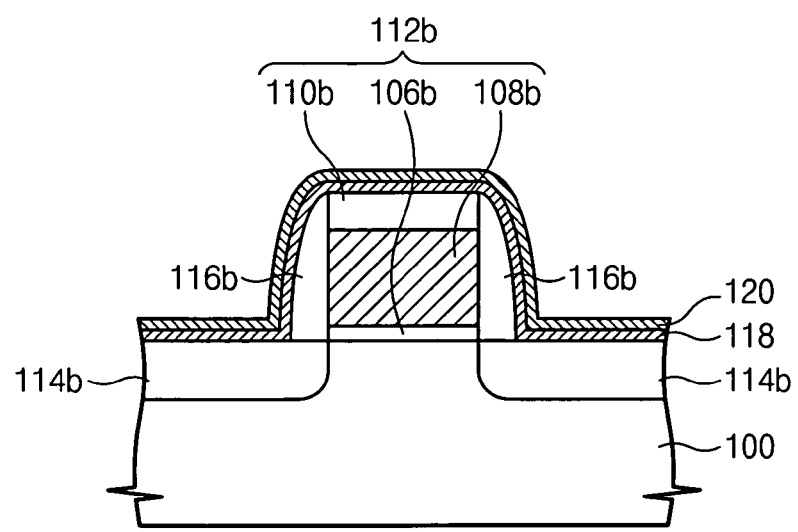

FIG. 3 is a plan view showing a mask ROM device in accordance with an embodiment of the present invention. FIGS. 4A, 4B, and 4C are cross-sectional views taken along lines I-I', II-II', and III-III' respectively in FIG. 3.

With reference to FIGS. 3, 4A, 4B, and 4C, a device isolation layer defining active regions 104a and 140b is formed on a semiconductor substrate 100 (hereinafter referred to as "a substrate") having a cell region a and a peripheral region b. Line-shaped cell active regions 104a are arranged along a row direction that is side by side in the cell region a. A peripheral circuit active region 104b is arranged in the peripheral circuit region b.

A plurality of cell gate patterns 112a cross the cell active regions 104a along a row direction. The cell gate pattern 112a includes a cell gate insulating layer 106a, a cell gate electrode 108a, and a cell capping pattern 110a, which are sequentially stacked. Cell source/drain regions 114a are arranged in the cell active region 104a at opposing sidewalls of the cell gate pattern. A cell insulating spacer 116a is arranged at opposing sidewalls of the cell gate pattern 112a.

The cell gate insulating layer 106a may be formed of a silicon oxide layer, in particular, a thermal oxide layer. The cell gate electrode 108a may be formed of a conductive layer, e.g., a doped polysilicon, a polycide, or a conductive metal-contained material. The conductive metal-contained material may include a metal (e.g., tungsten or molybdenum) and conductive metal nitride material (e.g., nitride titanium or nitride tantalum). The cell capping pattern 110a may be formed of an insulating material such as a silicon oxide layer or a silicon nitride layer. The cell source/drain regions 114a is formed of an impurity doped region. The cell insulating spacer 116a may be formed of a silicon oxide layer or a silicon nitride layer. The cell insulating spacer 116a and the cell capping pattern 110a may be formed of the same material.

The cell gate pattern 112a, the cell source/drain regions 114a, and the cell insulating spacer 116a are included in unit cell of the mask ROM device.

A plurality of cells formed in one cell active region 104a are serially connected with each other to be constituted with a cell string. That is, the mask ROM device includes a plurality of strings having a plurality of cells, which are serially connected, respectively. The cell shares a neighboring cell and cell source/drain regions 114a. Accordingly, the mask ROM device is a NAND-type mask ROM device.

The cell string may include one transistor (not shown) serially connected to one side of the cells. In one side of the selection transistor opposite the cells, a common drain region (not shown) may be arranged. One cell string may be connected to one common drain region. A bit line (not shown), which is connected to the common drain region and is parallel to the cell active region 104a, may be arranged. The bit line is arranged over the cells in the cell string. One selection transistor is arranged in the cell strings so that one cell string can be connected to the one bit line.

At least one cell is a programmed cell 150. FIGS. 4A and 4B show a section of a non-programmed cell and a programmed cell 150.

It is preferable that the programmed cell 150 includes a cell metal silicide 122a formed on a surface of the cell source/drain regions of the programmed cell 114a. In addition, it is preferable that the cell metal silicide 122a is arranged on a surface of the cell source/drain regions 114a of the non-programmed cell. In other words, the cell metal silicide 122a may be formed on a surface of the cell source/drain regions 114a of all cells.

The programmed cell 150 includes a cell metal pattern 118a extended along an upper surface of the cell capping pattern 110a and an external sidewall of the cell insulating spacer 116a. The cell metal pattern 118a is electrically connected to the metal silicide 122a at opposing sides of the cell gate pattern of the programmed cell 150. The cell source/drain regions 114a of the programmed cell 150 are electrically connected by the cell metal pattern 118a with each other. As a result, the programmed cell 150 is always in a turn-on state. At this time, the cell metal pattern 118a and the cell gate electrode 108a are insulated from each other by the cell insulating spacer 116a and the cell capping pattern 110a, which have sufficient thickness.

The cell metal pattern 118a may be formed of one of cobalt, nickel, and titanium. Preferably, the cell metal pattern 118a and the cell metal silicide 122a include the same metal. For instance, depending on a material of the cell metal pattern 118a, the cell metal silicide 122a may be formed of one of nickel silicide, cobalt silicide and titanium silicide.

The non-programmed cell does have the cell metal pattern 118a. Hence, the non-programmed cell may be in turn-off state or turn-on state according to a voltage applied to the cell gate electrode 108a of the non-programmed cell. The programmed cell 150 and the non-programmed cell may be equivalent to a cell having a conventional depletion channel region and an ion-implanted cell for programming.

It is preferable that the programmed cell 150 includes a cell reaction preventing pattern 120a covering the cell metal pattern 118a. The cell reaction preventing pattern 120a may be extended over the metal silicide 122a connected to the cell metal pattern 118a. An interlayer insulating layer 130 covering an entire surface of the substrate 100 is arranged. The interlayer insulating layer 130 may be formed of a silicon oxide layer.

The cell reaction preventing layer 120a prevents the reaction between the cell metal pattern 118a and the interlayer insulating layer 130. For example, the cell reaction preventing pattern 120a is capable of preventing the cell metal pattern 118a from being oxidized by the interlayer insulating layer 130 formed of an oxide layer. Accordingly, any loss due to a reaction of the cell metal pattern 118a will be small so that it is possible to maintain the resistance of the cell metal pattern 118a. The cell reaction preventing pattern 120a preferably has conductivity. For example, the cell reaction preventing pattern 120a that is formed of a conductive metal nitride material is formed with a single layer or a combination of layers of nitride titanium, nitride tantalum or nitride titanium aluminum.

A peripheral circuit gate pattern 112b crossing the peripheral circuit active region 104b is arranged in the peripheral region b. The peripheral circuit gate pattern 112b includes a gate insulating layer, a peripheral circuit gate electrode 108b, and a peripheral circuit capping pattern 110b, which are sequentially stacked. Peripheral source/drain regions 114b are arranged in the peripheral circuit active region 104b at opposing sides of the peripheral gate pattern 112b. A peripheral circuit insulating spacer 116b is arranged at opposing sidewalls of the peripheral circuit gate pattern 112b. A peripheral circuit metal silicide 122b is arranged on the surface of the peripheral circuit source/drain regions 114b. The peripheral circuit gate pattern 112b, the peripheral source/drain regions 114b, and the peripheral metal silicide 122b are included in a peripheral circuit transistor.

The cell and peripheral circuit gate insulating layers 106a and 106b may be formed of the same material as each other. The cell and the peripheral circuit gate electrodes 108a and 108b may be formed of the same material. The cell and the peripheral circuit capping patterns 110a and 110b may be formed of the same material. The peripheral circuit source/drain regions 114b are formed of an impurity doped layer. The cell and peripheral source/drain regions 114a and 114b are doped with the same type impurities or different type impurities.

The peripheral circuit metal silicide 122b and the cell metal pattern 118a preferably include the same metal. More particularly, the cell metal silicide 122a, the peripheral circuit metal silicide 122b, and the cell metal pattern 118a include the same metal as each other. For example, depending on the material of the cell metal pattern 118a, the cell metal silicide 122a may be formed of one of nickel silicide, cobalt silicide and titanium silicide.

In the mask ROM device with the above-mentioned structure, the cell source/drain regions 114a of the programmed cell 150 are electrically connected through the cell metal pattern 118a with each other. Accordingly, the mask ROM device does not require an ion implantation process for a conventional program. As a result, characteristic degradation of a cell by a conventional ion implantation can be prevented, and there is no requirement for an ion implantation apparatus of high energy to improve productivity.

Additionally, the cell metal pattern 118 has a significantly lower resistivity than the conventional depletion channel. Moreover, the cell metal pattern 118a is connected to a cell metal silicide 122a formed on the surface of cell source/drain regions 114a of the programmed cell. For this reason, the programmed cell 150 can operate at high speed. The cell metal silicide 122a is arranged on the surfaces of the cell source/drain regions 114a for all cells in the cell string. Therefore, the access time with respect to the cells in the cell string can be reduced. Also, since the peripheral circuit metal silicide 122a is arranged on the peripheral circuit source/drain regions 114a, the peripheral circuits can operate at high speed. As a result, a high-speed mask ROM device can form. In addition, a mask ROM device of low power dissipation can form.

FIGS. 5A to 7A are cross-sectional views illustrating a method for forming the mask ROM device according to an embodiment of the present invention. FIGS. 5B to 7B are cross-sectional views illustrating the method of forming the mask ROM device according to an embodiment of the present invention taken along line II-II' in FIG. 3. FIGS. 5C to 7C are cross-sectional views illustrating the method of forming the mask ROM device according to an embodiment of the present invention taken along line III-III' in FIG. 3.

With reference to FIGS. 3, 5A, 5B, and 5C, a device isolation layer is formed at predetermined regions of the substrate 100 having a cell region a and a peripheral region b to define a plurality of cell active regions 104a in the cell region a and a peripheral circuit active region 104b in the peripheral region b. The cell active regions 104a are arranged side by side along a row direction.

A plurality of cell gate patterns 112a crossing the cell active regions 104a in a line are formed. A peripheral circuit active region 112b crossing the peripheral circuit active region 104b is formed. The cell and the peripheral circuit gate pattern 112b may be formed at the same time. The cell gate pattern 112a is formed to include a cell gate insulating layer 106a, a cell gate electrode 108a, and a cell capping pattern 110a, which are stacked sequentially. The peripheral circuit gate pattern 112b is formed to include a peripheral circuit gate insulating layer 106b, a peripheral circuit gate electrode 108b, and a peripheral capping pattern 110b, which are stacked sequentially.

The cell and the peripheral circuit gate insulating layers 106a and 106b may be formed of a silicon oxide layer, in particular, a thermal oxide layer. The cell and the peripheral circuit gate electrodes 108a and 108b may be formed to include a conductive layer such as a doped polysilicon, polycide or a conductive metal-contained material. The cell and the peripheral circuit capping patterns 110a and 110b are formed of insulating materials. For example, the cell and peripheral circuit capping pattern 110a and 110b may be formed of an insulating layer such as a silicon oxide layer and a silicon nitride layer.

Impurity ions are implanted using the cell gate pattern 112a as a mask to form cell source/drain regions 114a in a cell active region 104a at opposing sides of the cell gate pattern 112a. Impurity ions are implanted using the peripheral circuit gate pattern 112b as a mask to form peripheral circuit source/drain regions 114b in the peripheral circuit active region 104b at opposing sides of the peripheral circuit gate pattern 112b. The cell and the peripheral circuit source/drain regions 114a and 114b may be formed at the same time. In this case, the cell and peripheral source/drain regions 114a and 114b are doped with the same-type impurities. Unlike this, the cell and the peripheral source/drain regions 114a and 114b may be formed sequentially. At this time, the cell and peripheral source/drain regions 114a and 114b may be doped with different-type impurities.

A cell insulating spacer 116a is formed at opposing sidewalls of the cell gate pattern 112a, and a peripheral circuit insulating spacer 116b is formed at opposing sidewalls of the peripheral circuit gate pattern 112b. The cell and the peripheral circuit insulating spacers 116a and 116b may be formed at the same time. The insulating spacers 116a and 116b are formed of an insulating layer. For instance, the insulating spacers 116a and 116b may be formed of a silicon oxide layer or a silicon nitride layer. The insulating spacers 116a and 116b may be formed of the same material as the capping patterns 110a and 110b.

Although not shown, after forming the insulating spacers 116a and 116b, the cell and the peripheral circuit source/drain regions 114a and 114b may have a lightly doped drain (LDD) structure by implanting impurities at a high dose.

A metal layer 118 and a reaction preventing layer 120 are conformally deposited on an entire surface of the substrate 100. The metal layer 118 may be formed from one of cobalt, nickel, and titanium. The reaction preventing layer 120 is formed from a material that prevents the reaction between the metal layer 118 and an interlayer insulating layer formed in a subsequent process. Specifically, it is preferable that the reaction preventing layer 120 is formed of a conductive material. For instance, the reaction preventing layer 120 is formed of a conductive metal nitride constituted with a single layer or a combination layer of nitride titanium, nitride tantalum, nitride tungsten, or nitride titanium aluminum.

Figure 6A:
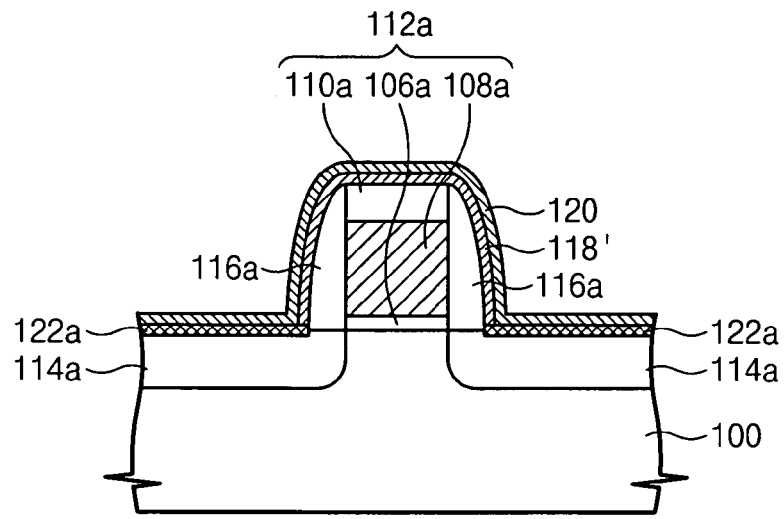
Figure 6B:
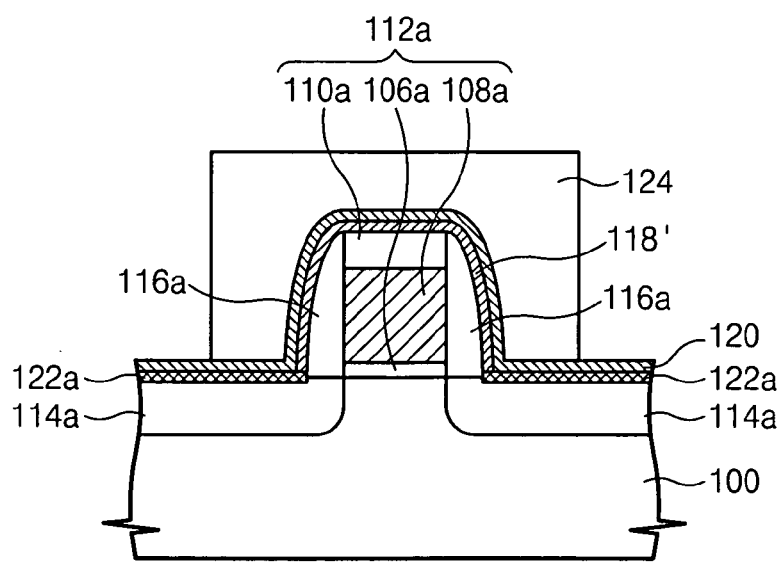
Figure 6C:
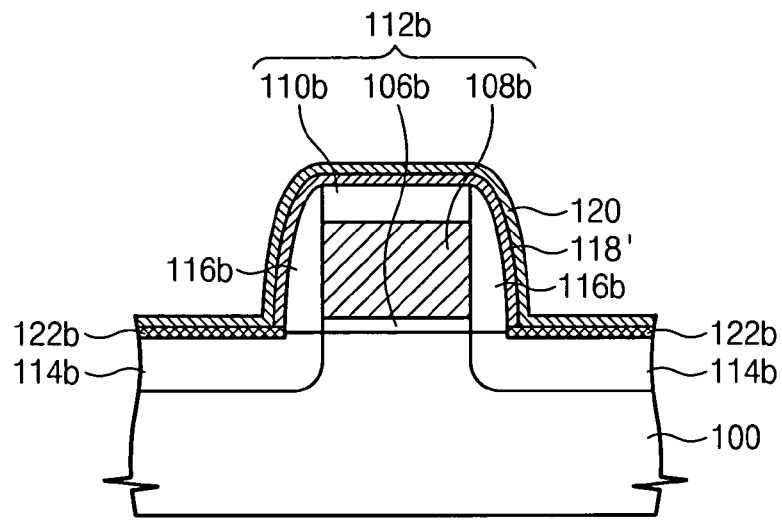

With reference to FIGS. 6A, 6B, and 6C, the surfaces of the metal layer 118 and the source/drain regions 114a and 114b are reacted by performing a silicidation process with respect to the substrate 100 to form metal silicides 122a and 122b. The cell and peripheral circuit metal silicides 122a and 122b are formed on surfaces of the cell and peripheral circuit source/drain regions 114a and 114b, respectively. Preferably, the process for depositing the metal layer 118 and the silicidation process are performed in-situ. That is, it is preferable that the process for depositing the metal layer 118 in one process chamber and the silicidation process are performed at the same time. Depending on the kind of the metal layer 118, the metal silicides 122a and 122b is formed from one of cobalt silicide, nickel silicide, and titanium silicide. After forming the metal silcides 112a and 112b, the unreacted metal layer 118' remains on the substrate 100.

Then, a mask pattern 124 is formed on the reaction preventing layer 120. The mask pattern 124 covers a cell gate pattern 112a and a cell insulating spacer 116a of a programmed cell of FIG. 3. It is preferable that the mask pattern 124 is extended to cover a part of a cell metal silicide 122a of the programmed cell 150. The mask pattern 124 may be a photoresist pattern.

Figure 7A:
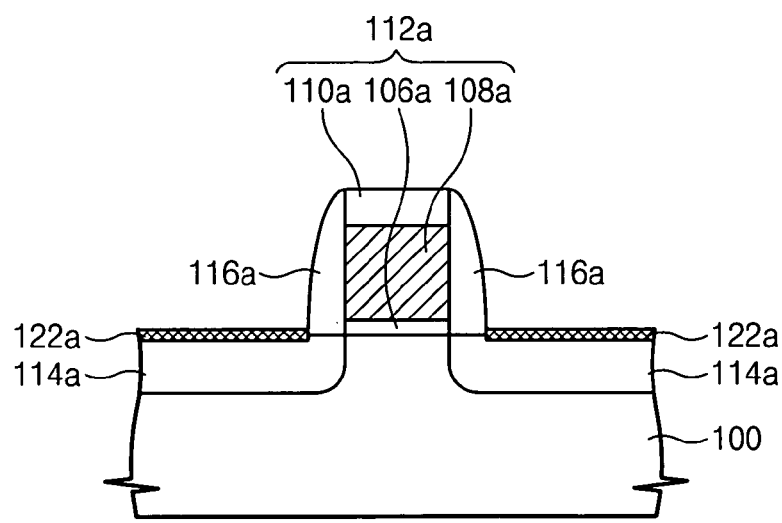
Figure 7B:
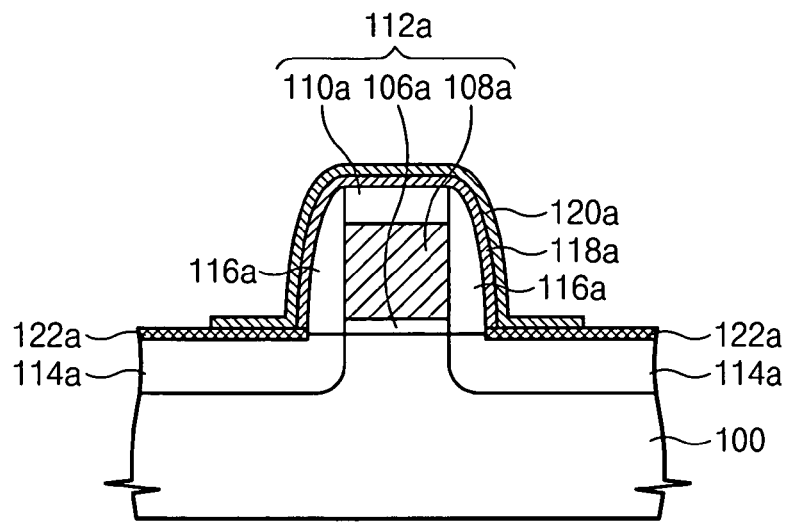
Figure 7C:
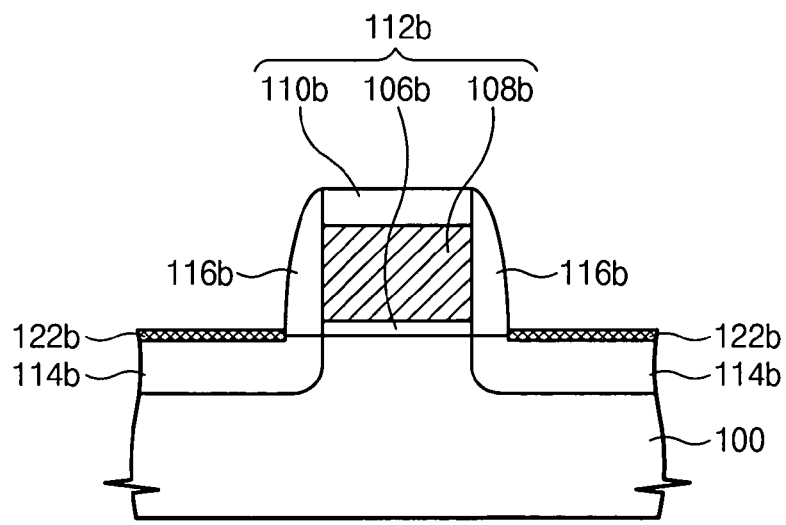

With reference to FIGS. 7A, 7B, and 7C, the reaction preventing layer 120 and the unreacted metal layer 118' are successively etched using the mask pattern 124 as an etch mask to form a cell metal pattern 118a and a cell reaction preventing pattern 120a, which are sequentially stacked. The cell reaction preventing pattern 120a is formed to completely cover the cell metal pattern 118a. The cell metal pattern 118a is formed in the programmed cell 150 of FIG. 3. The cell metal pattern 118a is extended along the external sidewalls of the cell insulating spacer 116a of the programmed cell 150 and the upper surfaces of the cell capping pattern 110a to be electrically connected to the cell metal silicides 122a of the programmed cell 150. Accordingly, cell source/drain regions 114a of the programmed cell 150 are electrically connected with each other. The reaction preventing layer 120 and the unreacted metal layer 118' on the non-programmed cells and the peripheral circuit transistors 114a are removed completely. In etching the unreacted metal layer 118', it is preferable that an etch process having an etch selectivity with respect to the metal silicides 122a and 122b is removed. Thus, the metal silicides 122a and 122b remain.

Then, the mask pattern 124 is removed. An interlayer insulating layer 130 of FIGS. 4A, 4B, and 4C is formed on the entire surface of the resultant.

In the above-mentioned method for forming the mask ROM device, the programmed cell 150 is formed to include the cell capping pattern 118a for electrically connecting the cell source/drain regions 114a of the programmed cell 150. That is, this method does not require a conventional ion implantation process. Accordingly, the characteristic degradation of cells by the conventional ion implantation method can be prevented. Also, it is possible to improve productivity because an ion implantation apparatus of high energy is not required.

Moreover, the cell metal pattern 118a has a lower resistivity than a conventional depletion channel region, and the metal silicides 122a and 122b reduce the resistance of the source/drain regions 114a and 114b. As a result, a mask ROM device having high speed and low power dissipation can be formed.

Furthermore, the metal silcides 122a and 122b are formed using the metal layer 118 for forming the cell metal pattern 118a. Accordingly, the metal silcides 122a and 122b are formed to have the same metal. As a result, the method for forming the mask ROM device including a programming process is simplified to improve productivity.

In another embodiment of the present invention, a NAND-type mask ROM device having another shape is disclosed. In the mask ROM device of the present invention, a couple of cell strings adjacent with each other are commonly connected to one bit line. The mask ROM device according to the present invention is similar to the first embodiment discussed above. Thus, like components denote like reference numerals.

Figure 8:
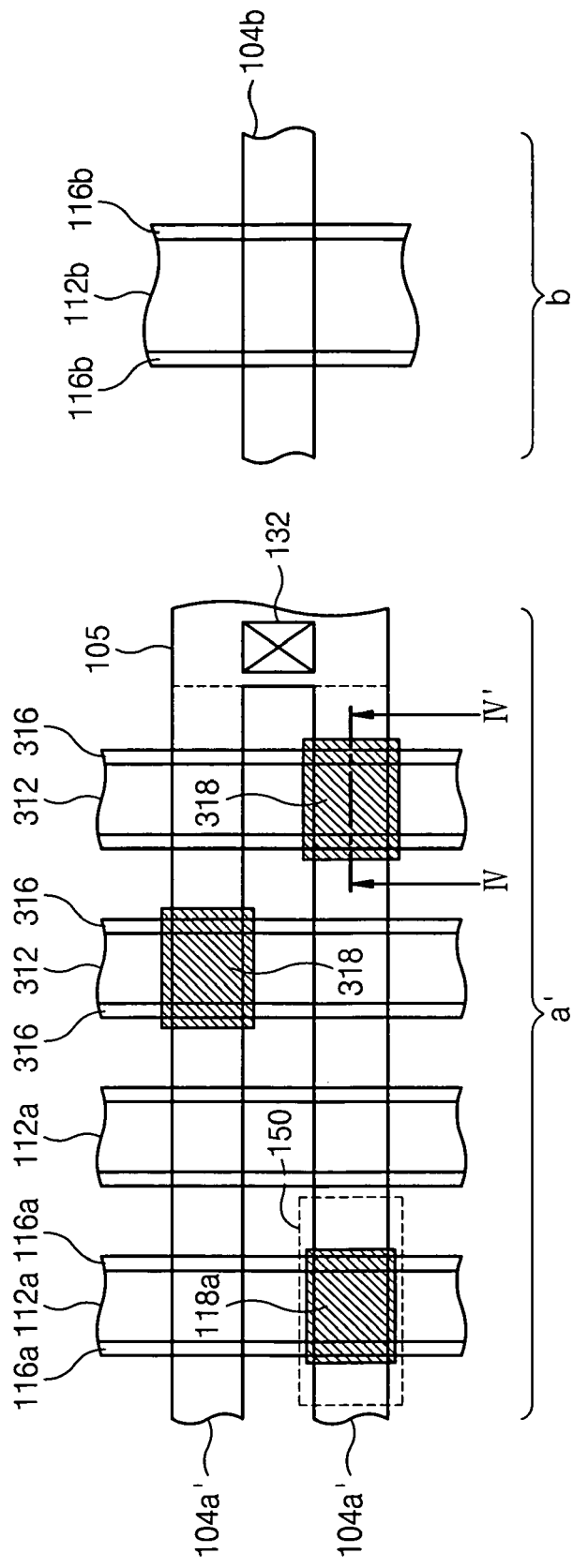
FIG. 8 is a plan view showing a mask ROM device according to another embodiment of the present invention.
Figure 9:
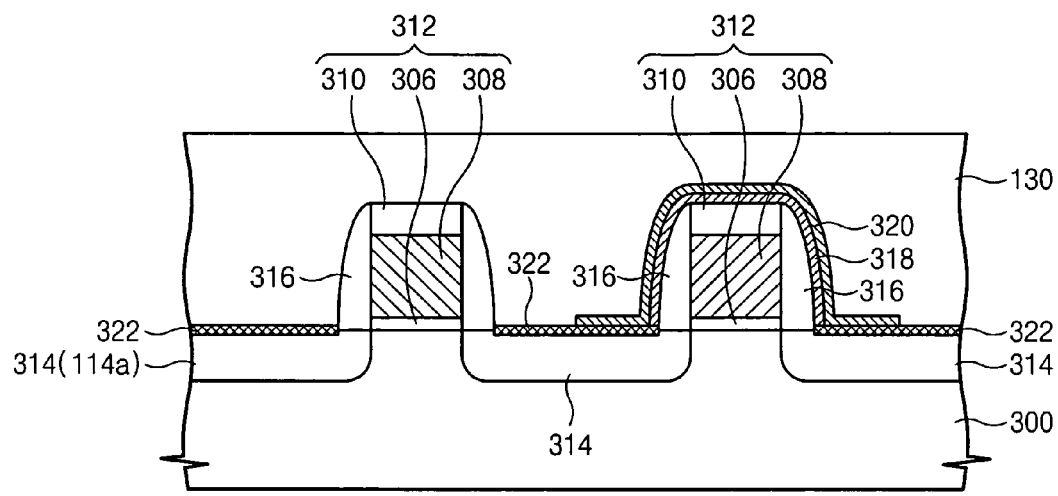
FIG. 9 is a cross-sectional view taken along line IV-IV' of FIG. 8.

FIG. 8 is a plan view showing a mask ROM device according to another embodiment of the present invention. FIG. 9 is a cross-sectional view taken along line IV-IV' of FIG. 8.

With reference to FIGS. 8 and 9, a device isolation layer defining active region 104a', 105, and 104b is arranged on a substrate 100 having a cell region a' and a peripheral region b. A couple of cell active regions 104a' and a connection active region 105 are arranged in the cell region a'. The couple of cell active regions 104a' are arranged in a line, and the connection active region 105 connects ends of the cell active regions 104a'. The couple of cell active regions 104a' and the connection active region 105 may be arranged in the cell region a' repeatedly. A peripheral circuit active region 104b is arranged in the peripheral circuit region b. A peripheral circuit transistor having the same structure as the above-mentioned first embodiment may be arranged in the peripheral circuit region b.

A plurality of cell gate patterns 112a cross the couple of cell active regions 104a' in a line. A couple of selection gate patterns 312 are arranged in one side of the cell gate patterns 112a in a line. The selection gate patterns 312 cross the couple of cell active regions 104a' in a line. The couple of selection gate patterns 312 are adjacent to the connection active region 105. In other words, the cell gate patterns 112a are arranged on one side of the couple of selection gate patterns 312, and the connection active region 105 is arranged on the other side of the selection gate patterns 312.

A cell string is formed in the cell active region 104a'. The cell string includes a plurality of cell serially connected and a couple of selection transistors sequentially connected in a series to the cells. In other words, the cell gate patterns 112a on the cell active region 104a' include serially connected cells. The couple of selection gate patterns 312 that are arranged on the cell active region 104a' are included in the couple of selection transistors, respectively. At least one of the cells is a programmed cell 150. That is, the cells include the programmed cell 150 and a non-programmed cell. The programmed cell 150 and the non-programmed cell have the same structure as the above-mentioned first embodiment.

The selection gate pattern 312 includes a selection gate insulating layer 306, a selection gate electrode 308, and a selection capping pattern 310, which are sequentially stacked. Selection source/drain regions 314 are arranged in the cell active region 104a' at opposing sides of the selection gate pattern 312. The selection source/drain regions 314 are formed of an impurity doped layer. The source/drain regions 314 adjacent to the cell gate pattern 112a may share with cell source/drain regions 114a located at one side of the cell gate pattern 112a. The selection source/drain regions 314 adjacent to the connection active region 105 are extended in the connection active region 105 to electrically connect with each other. An extension unit of the selection source/drain regions 314 in the connection active region 105 is equivalent to a common drain region of the couple of the cell strings.

A selection insulating spacer 316 is formed at opposing sidewalls of the selection gate pattern 312, and a selection metal silicide 322 is formed on a surface of the selection source/drain regions 314. The selection gate pattern 312, the selection source/drain regions 314, and the selection metal silicide 322 are included in the selection transistor. The selection transistor adjacent to the cells is defined as a first selection transistor, and the transistor adjacent to the connection active region 105 is defined as a second selection transistor.

Each of the first and second selection transistors includes a selection metal pattern 318, which is extended along external walls of the selection insulating spacer 316 and upper surfaces of the selection capping pattern 310 of the chosen select transistor. The selection metal pattern 318 is electrically connected to the selection metal silicides 322 of the chosen select transistor. That is, the selection metal pattern 318 electrically connects the selection source/drain regions 314 of the chosen select transistor.

A selection reaction preventing pattern 320 covering the selection metal pattern 318 is arranged. The selection reaction preventing pattern 320 may be extended over the selection metal silicide 322 that is connected to the selection metal pattern 318. An interlayer insulating layer 130 covering an entire surface of the substrate 100 is formed. The selection reaction preventing pattern 320 prevents the reaction between the selection metal pattern 318 and the interlayer insulating layer 130.

It is preferable that the selection metal pattern 318 be arranged in the couple of cell strings in zigzag form. For example, it is preferable that a first selection transistor being one of the couple of cell strings and a second transistor being the other of the couple of cell strings include selection metal pattern 318, respectively. Accordingly, different operation voltages are applied to the couple of selection gate electrodes 318 so that one of the couple of cell strings can be selected.

A bit line contact 132, which penetrates the interlayer insulating layer 130 to be connected to the selection source/drain regions 314 in the connection active region 105, is formed. Although not shown, a bit line connected to the bit line contact 132 may form on the interlayer insulating layer 130. One bit line is connected to the couple of cell strings. The bit line and the cell active region 104a' may form in a line.

Next, the programmed cell 150, the chosen select transistor, and the peripheral circuit transistor will be comparatively described referring to FIGS. 4B and 4C.

With reference to FIGS. 4B, 4C, 8, and 9, it is preferable that a cell metal pattern 118a and a cell metal silicide 122a of the programmed cell 150, and a selection metal pattern 318 and a selection metal silicide of the chosen select transistor include the same metal.

Furthermore, it is preferable that the selection metal pattern 318 and the selection metal silicide 322 include the same metal as a peripheral metal silicide 122b. In more detail, the selection metal pattern 318 may be formed of the same material as the cell metal pattern 118a.

Preferably, the selection reaction preventing pattern 320 and the cell reaction preventing pattern 120a are formed of the same material. For instance, it is preferable that the cell reaction preventing pattern 120a is formed of conductive metal nitride constituted with a single layer or a combination layer of nitride titanium, nitride tantalum, nitride tungsten, and nitride titanium aluminum.

Preferably, the selection gate insulating layer 306 is formed of the same material as the cell gate insulating layer 106a. The selection gate electrode 308 is formed of the same material as the cell gate electrode 108a. The selection capping pattern 310 is formed of the same material as the cell capping pattern 110a. The insulating spacer 316 is formed of the same material as the cell insulating spacer 116a.

In the above-mentioned mask ROM device, the mask ROM device can obtain the same effect mentioned in the first embodiment.

Furthermore, selection source/drain regions 314 of the chosen select transistor are electrically connected by the selection metal pattern 318 having low resistivity. In addition, the selection metal silicide 322 is arranged on a surface of the selection source/drain regions 314 of another chosen select transistor. As a result, the access time of the cells in the cell string is dramatically reduced so that a high-speed mask ROM device can form. Moreover, a mask ROM device of low power dissipation can form.

Next, the above-mentioned mask ROM device will be described. In the same manner of the above-mentioned first embodiment, the programmed cell 150, non-programmed cell, and the peripheral circuit transistor of the mask ROM device may form. Accordingly, a method for forming the selection transistors is mainly described referring to the Figures of the first embodiment.

Figure 10:
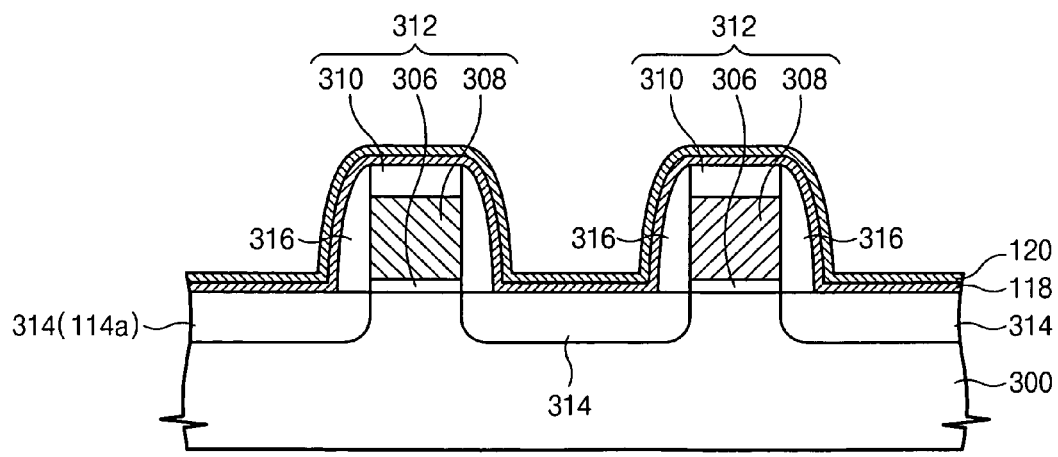
FIGS. 10 to 12 are cross-sectional views illustrating the method of forming a mask ROM device according to another embodiment of the present invention taken along line IV-IV' of FIG. 8.
Figure 11:
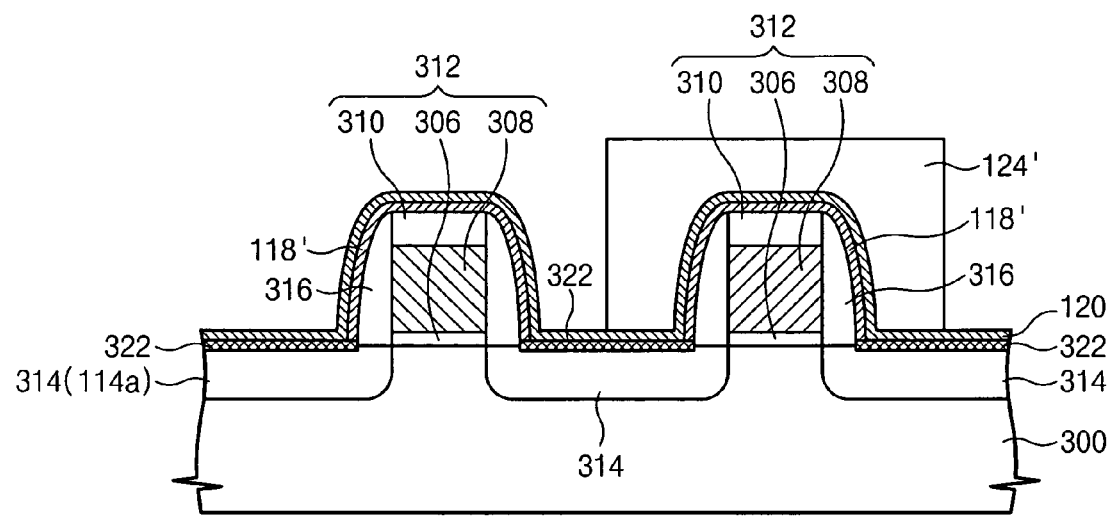
Figure 12:
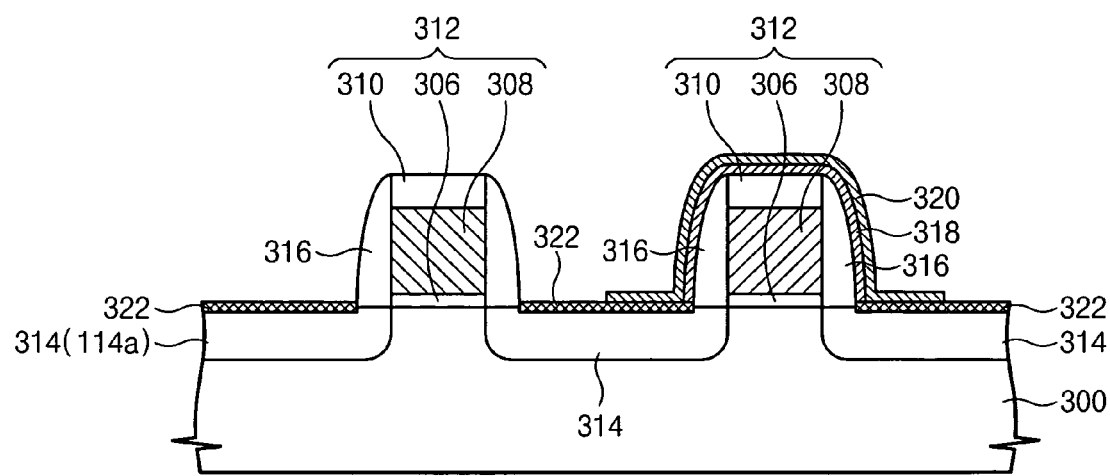

FIGS. 10 to 12 are cross-sectional views illustrating the method of forming a mask ROM device according to another embodiment of the present invention taken along line IV-IV' of FIG. 8.

With reference to FIGS. 5A, 5B, 5C, 8 and 10, a device isolation layer is formed on the substrate 100 to define a cell active region 104a', a connection active region 105, and a peripheral active region 104b.

Cell gate pattern 112a crossing the cell active region 104a' is formed. A peripheral circuit gate pattern 112b crossing a couple of the selection gate pattern 312 and the peripheral active region 104b is formed.

The selection gate pattern 312 includes a selection gate insulating layer 306, a selection gate electrode 308, and a selection capping pattern 310, which are sequentially stacked. It is preferable that the selection gate pattern 312 and the cell gate patterns 112a are formed at the same time. Preferably, the selection gate insulating layer 306 is formed of the same material as the cell gate insulating layer 106a. The selection gate electrode 308 is formed of the same material as the cell gate electrode 108a. The selection capping pattern 310 is formed of the same material as the cell capping pattern 110a.

Impurity ions are implanted using the selection gate pattern 312 as a mask to form selection source/drain regions 314 at the cell active region 104a' at opposing sides of the selection gate pattern 312. Then, the selection source/drain regions 314 are formed in the connection active region 105. It is preferable that the selection source/drain regions 314 and the cell source/drain regions 114a are formed at the same time.

A selection insulating spacer 316 is formed at opposing sidewalls of the selection gate pattern 312. It is preferable that the selection insulating spacer 316 and a cell insulating spacer 116a are simultaneously formed of the same material.

A metal layer 118 and a reaction preventing layer 120 are conformally formed on an entire surface of the substrate 100 in order. At this time, the metal layer 118 and the reaction preventing layer 120 cover the selection gate pattern 312, the selection source/drain regions 314 and the selection insulating spacer 316. The metal layer 118 and the reaction preventing layer 120 have the same material and characteristics as the above-mentioned first embodiment.

With reference to FIGS. 6A, 6B, 6C and 11, a cell metal silicide 122a, a peripheral metal silicide 122b, and a selection metal silicide 322 are formed at the same time by performing a silicidation process. A process for depositing the metal layer 118 and the silicidation process may be performed in-situ.

Then, a first photoresist pattern 124 and a second photoresist pattern 124' are formed in the reaction preventing layer 120. The first photoresist pattern 124 covers a cell gate pattern 112a and a cell insulating spacer 116a of a cell gate pattern 112 of a cell to be programmed. The second photoresist pattern 124' covers a selection gate pattern 312 and a selection insulating spacer 316 of the chosen select transistor of FIG. 8. The first photoresist pattern 124 may be extended over the cell metal silicide 122a of the programmed cell. The second photoresist pattern 124' may be extended over the selection metal silicide 322 of the chosen select transistor.

With reference to FIGS. 7A, 7B, 7C and 12, the reaction preventing layer 120 and an unreacted metal layer 118' are successively patterned using the first and second photoresist patterns 124 and 124' as an etch mask to simultaneously form a cell metal pattern 118a and a cell reaction preventing pattern 120a, and a selection metal pattern 318 and a selection reaction preventing pattern 320. The cell metal pattern 118a and the cell reaction preventing pattern 120a are sequentially stacked, and the selection metal pattern 318 and the selection reaction preventing pattern 320 are sequentially stacked. The cell reaction preventing pattern 120a is formed to completely cover the cell metal pattern 118a, and the selection reaction preventing pattern 320 is formed to completely cover the selection metal pattern 318.

After removing the photoresist patterns 124 and 124', the interlayer insulating layer 130 of FIG. 9 is formed on the entire surface of the substrate 100. Continuously, a bit line contact 132 penetrating the interlayer insulating layer 130 to be connected to the connection active region 105.

In accordance with the method for forming the mask ROM device, the effect mentioned in the first embodiment can be obtained. Furthermore, the metal silicides 122a, 122b, and 322 are formed using the metal layer 118 for forming the metal patterns 118a and 318. Accordingly, the method for forming the mask ROM device as well as a programming process is simplified so that productivity can be dramatically improved.

As previously mentioned, the programmed cell of a mask ROM device has a cell metal pattern. The cell metal pattern is extended along surfaces of a cell insulating spacer and a cell capping pattern of the programmed cell to electrically connect source/drain regions of the programmed cell. Thus, a conventional ion implantation process for programming is not required. As a result, characteristic degradation of a cell by the conventional ion implantation can be prevented. In addition, since there is no need for an ion implantation apparatus of high energy, productivity can improve.

Additionally, the cell metal pattern has a significantly lower resistivity than a conventional depletion channel. Accordingly, a mask ROM device having high-speed and/or low power dissipation can be formed.

Furthermore, metal silicides are formed on a surface of source/drain regions of cell and a peripheral circuit transistor using a metal layer for forming the cell metal pattern. Due to the metal silicides, the mask ROM device can be embodied in more high-speed and/or low power dissipation. Moreover, the cell metal pattern and metal silicides are formed using one metal layer, and thereby simplifying the process to improve productivity.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. In a mask ROM device including a plurality of cell strings having a plurality of cells that are serially connected, respectively, wherein at least one of the cells is a programmed cell, the programmed cell comprising:
    a cell gate pattern including a cell gate insulating layer, a cell gate electrode, and a cell capping pattern comprising an insulating material, which are sequentially stacked on a substrate;
    cell source/drain regions formed in the substrate at opposing sides of the cell gate pattern;
    a cell insulating spacer formed at opposing sidewalls of the cell gate pattern;
    a cell metal silicide formed on a surface of the cell source/drain regions; and
    a cell metal pattern extended along surfaces of the cell insulating spacer and the cell capping pattern to be connected to the cell metal silicides at opposing sides of the cell gate pattern,
    wherein the cell capping pattern and the cell insulating spacer insulate the cell gate electrode from the cell metal pattern.

2. The mask ROM device of claim 1, wherein the mask ROM device further includes a peripheral circuit transistor, and
    wherein the peripheral circuit transistor includes:
    a peripheral circuit gate pattern formed on the substrate;
    peripheral circuit source/drain regions formed in the substrate at opposing sides of the peripheral circuit gate pattern;
    a peripheral circuit insulating spacer formed at opposing sidewalls of the peripheral circuit gate pattern;
    and a peripheral circuit metal silicide formed on a surface of the peripheral circuit source/drain region, wherein the peripheral circuit metal silicide and the cell metal pattern include the same metal.

3. The mask ROM device of claim 1, wherein the cell metal silicide and the cell metal pattern include the same metal.

4. The mask ROM device of claim 1, further including a cell reaction preventing pattern covering the cell metal pattern.

5. The mask ROM device of claim 4, wherein the cell reaction preventing pattern is formed of conductive metal nitride.

6. The mask ROM device of claim 1, wherein the cell string further includes first and second selection transistors, which are serially connected to one side of the cells, and
    wherein a selected selection transistor of the first and second selection transistors includes:
    a selection gate pattern including a selection gate insulating layer, a selection gate electrode, and a selection capping pattern, which are sequentially stacked on the substrate;
    selection source/drain regions formed on the substrate at opposing sides of the selection gate pattern;
    a selection insulating spacer formed at opposing sidewalls of the selection gate pattern; a selection metal silicide formed on a surface of the selection source/drain regions; and
    a selection metal pattern extended along the selection insulating spacer and selection capping pattern to be connected to the selection metal silicides at opposing sides of the selection gate pattern.

7. The mask ROM device of claim 6, wherein the cell and the selection metal patterns, and the cell and the selection metal silicides include the same metal as each other.

8. The mask ROM device of claim 6, further comprising:
   a cell reaction preventing pattern covering the cell metal pattern; and
   a selection reaction preventing pattern covering the selection metal pattern.

9. The mask ROM device of claim 8, wherein the cell and the selection reaction preventing patterns are formed of conductive metal nitride.

10. In a mask ROM device including a plurality of cell strings having a plurality of cells that are serially connected, respectively, wherein at least one of the cells is a programmed cell, the programmed cell comprising:
   a cell gate pattern including a cell gate insulating layer, a cell gate electrode, and a cell capping pattern comprising an insulating material, which are sequentially stacked on a substrate;
   cell source/drain regions formed in the substrate at opposing sides of the cell gate pattern;
   a cell insulating spacer formed at opposing sidewalls of the cell gate pattern;
   a cell metal silicide formed on a surface of the cell source/drain regions;
   a cell metal pattern extended along surfaces of the cell insulating spacer and the cell capping pattern to be connected to the cell metal silicides at opposing sides of the cell gate pattern; and
   an interlayer insulating layer formed over the cell metal pattern.

* * * * *